United States Patent
Kim et al.

(10) Patent No.: US 10,147,851 B2
(45) Date of Patent: Dec. 4, 2018

(54) SEMICONDUCTOR LIGHT EMITTING DEVICE PACKAGE

(71) Applicant: SAMSUNG ELECTRONICS CO., LTD., Suwon-si (KR)

(72) Inventors: Hak Hwan Kim, Suwon-si (KR); Jung Tae Ok, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/839,235

(22) Filed: Dec. 12, 2017

(65) Prior Publication Data

US 2018/0102463 A1    Apr. 12, 2018

Related U.S. Application Data

(63) Continuation of application No. 15/240,030, filed on Aug. 18, 2016, now Pat. No. 9,871,172.

(30) Foreign Application Priority Data

Nov. 12, 2015 (KR) .................. 10-2015-0159217

(51) Int. Cl.
*H01L 33/00* (2010.01)
*H01L 33/50* (2010.01)
(Continued)

(52) U.S. Cl.
CPC ........ *H01L 33/502* (2013.01); *H01L 33/0095* (2013.01); *H01L 33/06* (2013.01);
(Continued)

(58) Field of Classification Search
None
See application file for complete search history.

(56) References Cited

U.S. PATENT DOCUMENTS 6,372,608 B1    4/2002    Shimoda et al.
6,645,830 B2   11/2003    Shimoda et al.
(Continued)

FOREIGN PATENT DOCUMENTS

KR    10-2010-0044401 A    4/2010
KR    10-2012-0077252 A    7/2012
(Continued)

OTHER PUBLICATIONS

International Preliminary Report on Patentability issued from the International Bureau in counterpart International Application No. PCT/JP2014/081607, dated Jun. 14, 2016.

*Primary Examiner* — Minhloan Tran
(74) *Attorney, Agent, or Firm* — Sughrue Mion, PLLC

(57) ABSTRACT

A semiconductor light emitting device package is provided and includes a light emitting diode (LED) chip including a first electrode and a second electrode, the LED chip having a first surface on which the first electrode and the second electrode are disposed, and a second surface opposing the first surface; a dam structure disposed on the first surface, an outside edge of the dam structure being co-planar with an outside edge of the LED chip; and a wavelength conversion layer disposed on side surfaces of the LED chip, the second surface of the LED chip, and a surface of the dam structure, the wavelength conversion layer containing a wavelength conversion material.

20 Claims, 13 Drawing Sheets

(51) Int. Cl.
*H01L 33/48* (2010.01)
*H01L 33/06* (2010.01)
*H01L 33/32* (2010.01)
*H01L 33/40* (2010.01)
*H01L 33/56* (2010.01)

(52) U.S. Cl.
CPC ............ *H01L 33/32* (2013.01); *H01L 33/405* (2013.01); *H01L 33/486* (2013.01); *H01L 33/50* (2013.01); *H01L 33/505* (2013.01); *H01L 33/507* (2013.01); *H01L 33/508* (2013.01); *H01L 33/56* (2013.01); *H01L 2933/005* (2013.01); *H01L 2933/0016* (2013.01); *H01L 2933/0041* (2013.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,754,512 B2 | 7/2010 | Taninaka et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,858,997 B2 | 12/2010 | Yoshimura et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,431,423 B2 | 4/2013 | Basin et al. | |
| 8,432,511 B2 | 4/2013 | Jeong | |
| 8,445,916 B2 * | 5/2013 | Kojima | H01L 33/40 257/76 |
| 8,459,832 B2 | 6/2013 | Kim | |
| 8,502,242 B2 | 8/2013 | Kim | |
| 8,536,604 B2 | 9/2013 | Kwak et al. | |
| 8,664,635 B2 * | 3/2014 | Jung | H01L 33/505 257/13 |
| 8,704,254 B2 | 4/2014 | Trottier et al. | |
| 8,735,931 B2 | 5/2014 | Han et al. | |
| 8,766,295 B2 | 7/2014 | Kim | |
| 8,957,428 B2 | 2/2015 | Jagt et al. | |
| 9,024,340 B2 * | 5/2015 | Minato | H01L 33/505 257/98 |
| 9,093,618 B2 * | 7/2015 | Tseng | H01L 33/504 |
| 2011/0284822 A1 | 11/2011 | Jung | |
| 2012/0068209 A1 | 3/2012 | Andrews | |
| 2013/0234154 A1 | 9/2013 | Kojima | |
| 2014/0291610 A1 | 10/2014 | Tseng et al. | |
| 2015/0034990 A1 | 2/2015 | Roitman et al. | |

FOREIGN PATENT DOCUMENTS

| | | |
|---|---|---|
| KR | 10-1186559 B1 | 10/2012 |
| KR | 10-2014-0130270 A | 11/2014 |

\* cited by examiner

I-I'

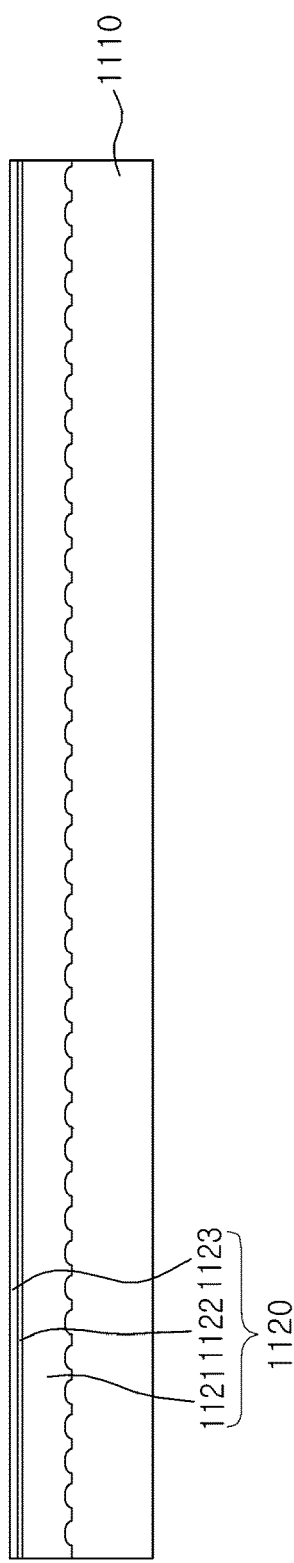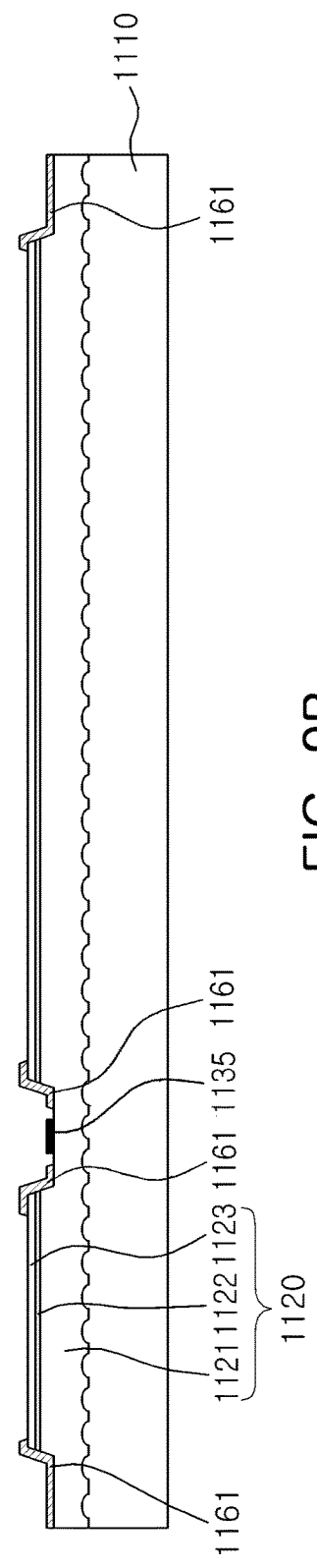

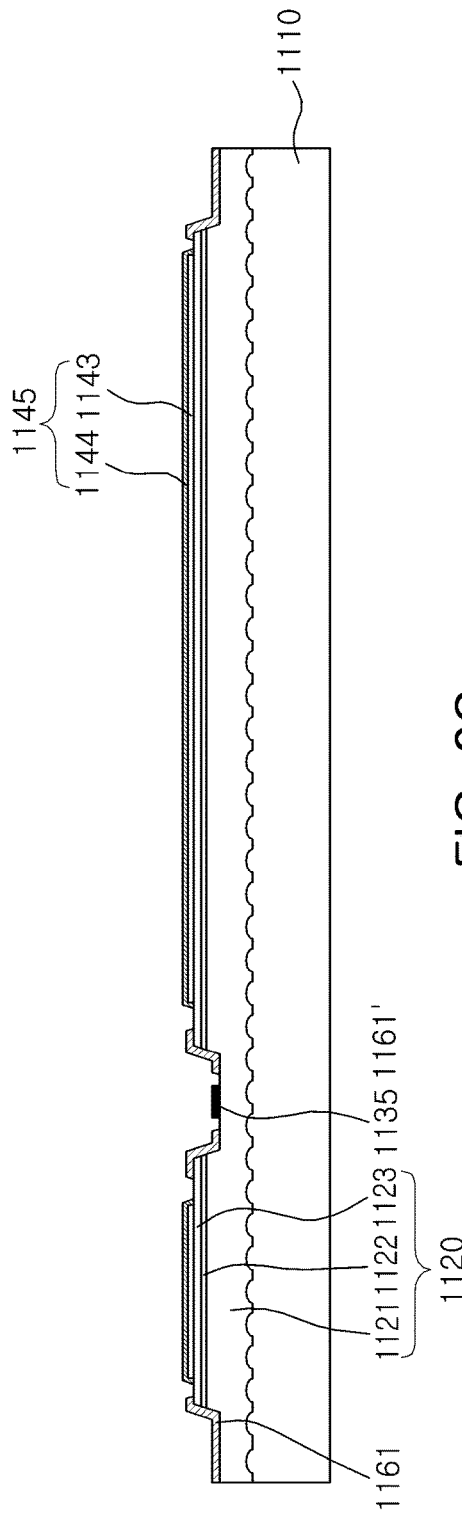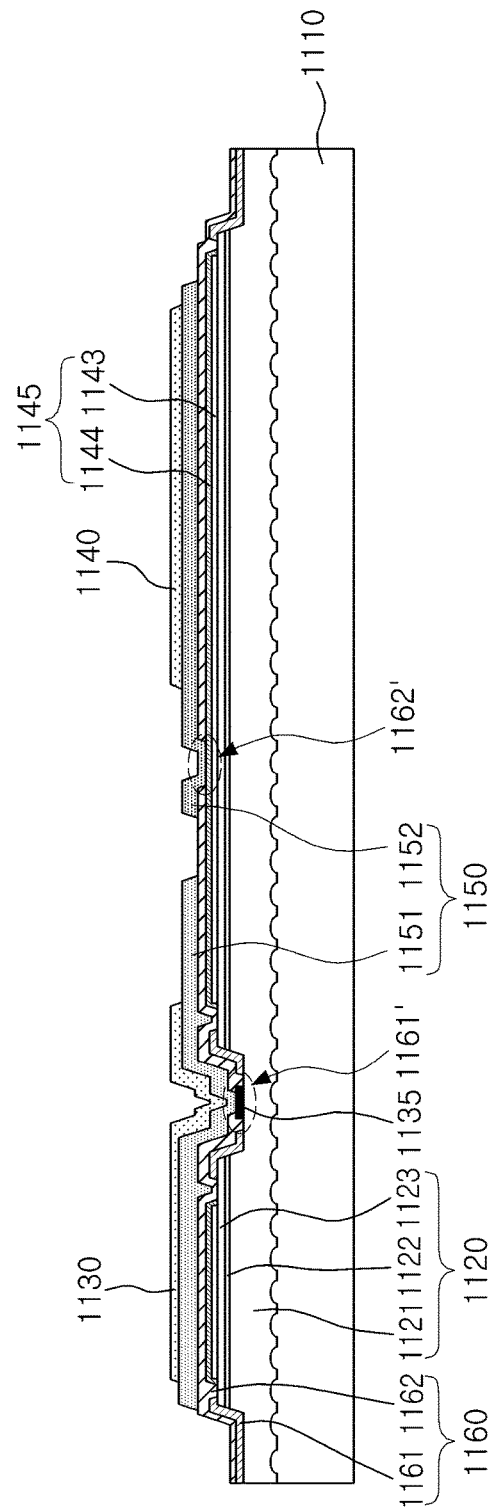

SEMICONDUCTOR LIGHT EMITTING DEVICE PACKAGE

CROSS-REFERENCE TO RELATED APPLICATION

This is a continuation of U.S. application Ser. No. 15/240,030 filed on Aug. 18, 2016, which claims priority from Korean Patent Application No. 10-2015-0159217, filed on Nov. 12, 2015 in the Korean Intellectual Property Office, the disclosure of which is incorporated by reference herein in its entirety.

BACKGROUND

Apparatuses, devices, and articles of manufacture consistent with the present disclosure relate to a semiconductor light emitting device package.

When a current is applied to a semiconductor light emitting device, the semiconductor light emitting device emits light using the principle of the recombination of electrons and holes, and semiconductor light emitting devices are widely used as light sources due to various advantages thereof, such as low power consumption, high brightness, and compact size. In particular, since nitride-based light emitting devices have been developed, the extent of the use of semiconductor light emitting devices has been expanding, and semiconductor light emitting devices have been employed in light source modules, home lighting fixtures, vehicle lighting, and the like.

With the increased use of semiconductor light emitting devices, the application of the semiconductor light emitting device has expanded to encompass high-current and high-output light source fields. As such, as semiconductor light emitting devices are used in high-current and high-output light source fields, improvements in luminous efficiency have been studied in the related art. In particular, a method of increasing an orientation angle of light emitted from a package in which a semiconductor light emitting device is provided is being investigated in fields related to light source modules.

SUMMARY

One or more example embodiments provide a semiconductor light emitting device package having improved color quality and an increased orientation angle of light.

According to an aspect of an example embodiment, there is provided a semiconductor light emitting device package including a light emitting diode (LED) chip having a first surface on which a first electrode and a second electrode are disposed, and a second surface opposing the first surface; a dam structure disposed on the first surface, an outside edge of the dam structure being co-planar with an outside edge of the LED chip; and a wavelength conversion layer disposed on side surfaces of the LED chip, the second surface, and at least one surface of the dam structure, the wavelength conversion layer containing a wavelength conversion material.

According to an aspect of another example embodiment, there is provided a semiconductor light emitting device package including an LED chip having a first surface on which a first electrode and a second electrode are disposed, a second surface opposing the first surface, and at least one side surface connecting the first surface to the second surface; and a wavelength conversion layer having an opening portion exposing at least a portion of each of the first electrode and the second electrode, the wavelength conversion layer disposed on the first surface, the second surface, and the at least one side surface of the LED chip, and the wavelength conversion layer containing a wavelength conversion material.

According to an aspect of another example embodiment, there is provided a semiconductor light emitting device package including a light emitting diode (LED) chip including a substrate, a light emitting structure disposed on the substrate, and a first electrode and a second electrode disposed on a surface of the light emitting structure opposite to the substrate, the first and second electrodes being electrically connected to the light emitting structure; and a wavelength conversion layer disposed to cover the substrate and at least one side surface of the LED chip.

BRIEF DESCRIPTION OF DRAWINGS

The above and/or other aspects will be more clearly understood from the following detailed description of example embodiments taken in conjunction with the accompanying drawings, in which:

FIGS. 9A through 9F are views illustrating a process of manufacturing the LED chip of FIG. 8A, according to an example embodiment;

DETAILED DESCRIPTION

Figure 1:
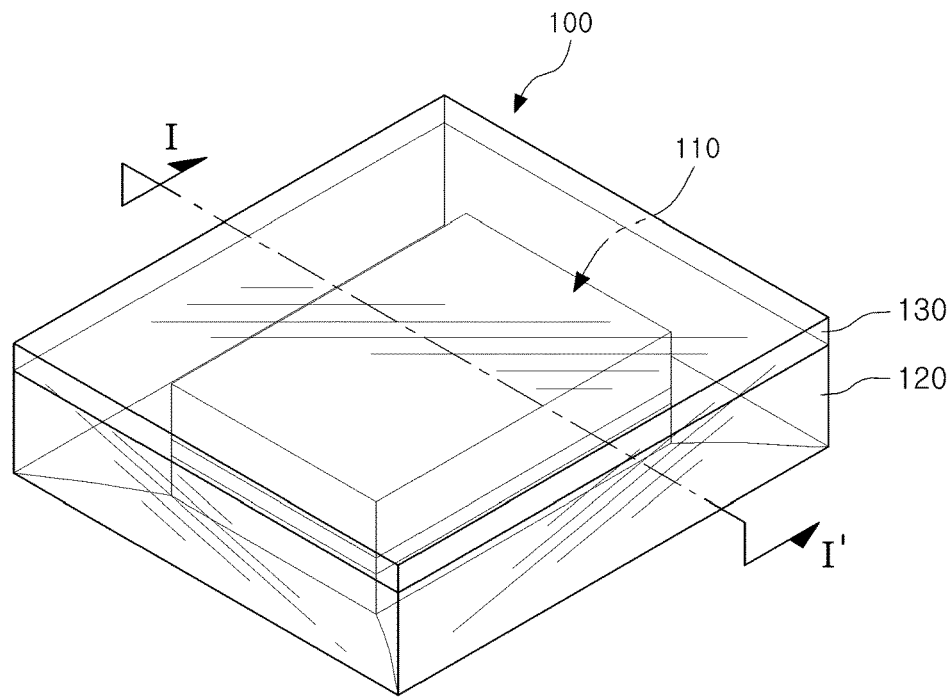
FIG. 1 is a schematic perspective view of a semiconductor light emitting device package according to an example embodiment.

Hereinafter, example embodiments will be described as follows with reference to the attached drawings.

The present inventive concept may, however, be exemplified in many different forms and should not be construed as being limited to the specific example embodiments set forth herein. Rather, these example embodiments are provided so that this disclosure will be thorough and complete, and will fully convey the scope of the disclosure to those skilled in the art.

Throughout the specification, it will be understood that when an element, such as a layer, region or substrate, is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms "first", "second", "third", etc. may be used herein to describe various members, components, regions, layers and/or sections, these members, components, regions, layers and/or sections should not be limited by these terms. These terms are only used to distinguish one member, component, region, layer or section from another region, layer or section. Thus, a "first" member, component, region, layer or section discussed below could be termed a "second" member, component, region, layer or section without departing from the teachings of the example embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular example embodiments only, and the present inventive concept is not limited thereby. As used herein, the singular forms "a," "an," and "the" are intended to include the plural forms as well, unless the context clearly indicates otherwise. It will be further understood that the terms "comprises," "includes," "comprising" and/or "including" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, example embodiments will be described with reference to schematic views illustrating example embodiments. In the drawings, for example, due to manufacturing techniques and/or tolerances, modifications of the shape shown may be estimated. Thus, example embodiments should not be construed as being limited to the particular shapes of regions shown herein, for example, to include a change in shape results in manufacturing. The following example embodiments may also be constituted by one or a combination thereof.

The contents of the present inventive concept described below may have a variety of configurations and propose only a required configuration herein, but are not limited thereto.

Figure 2:
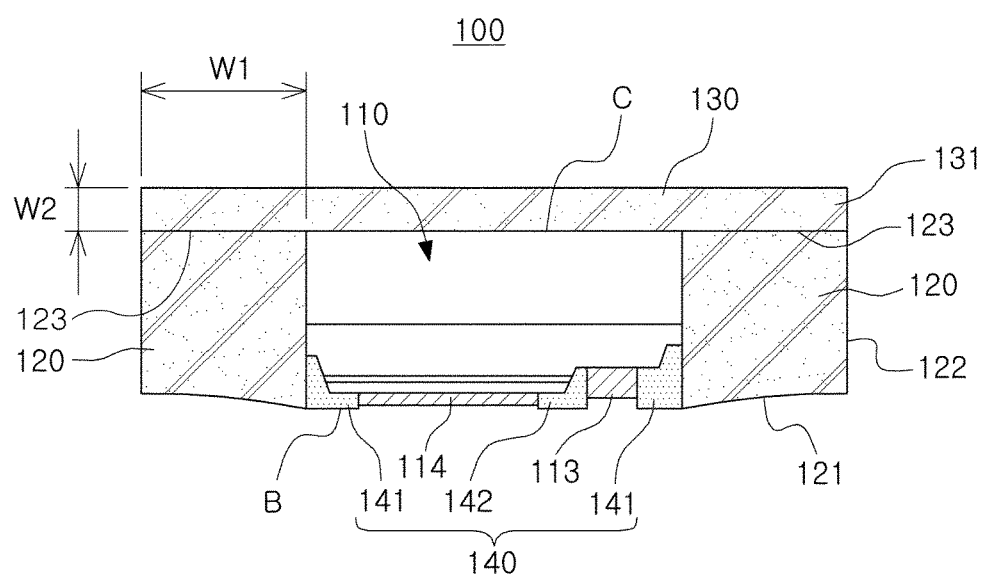
FIG. 2 is a schematic cross-sectional view taken along line I-I' of the semiconductor light emitting device package of FIG. 1.
Figure 3:
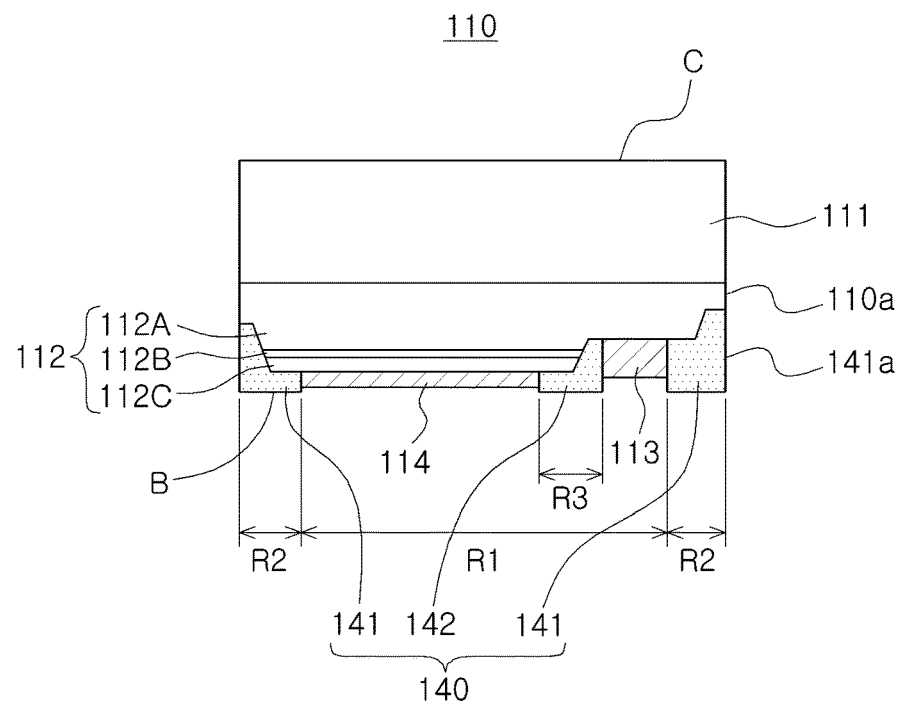
FIG. 3 is a schematic cross-sectional view of a light emitting diode (LED) chip of the semiconductor light emitting device of FIG. 2.

FIG. 1 is a schematic perspective view of a semiconductor light emitting device package according to an example embodiment. FIG. 2 is a schematic cross-sectional view taken along line I-I' of the semiconductor light emitting device package of FIG. 1. FIG. 3 is a schematic cross-sectional view of a light emitting diode (LED) chip of the semiconductor light emitting device package of FIG. 2.

Referring to FIGS. 1 and 2, a semiconductor light emitting device package 100 according to an example embodiment may include an LED chip 110 including a first electrode 113 and a second electrode 114, a lateral wavelength conversion layer 120 disposed on side surfaces of the LED chip 110, and an upper wavelength conversion layer 130 covering an upper surface of the LED chip 110.

Referring to FIG. 3, the LED chip 110 may have a first surface B on which the first and second electrodes 113 and 114 are disposed, and a second surface C opposing the first surface B.

The LED chip 110 may include a light transmitting substrate 111, and a light emitting structure 112 disposed on the light transmitting substrate 111. A surface of the light emitting structure 112 may form the first surface B, and the first and second electrodes 113 and 114 may be connected to the light emitting structure 112.

The light transmitting substrate 111 may be a substrate for semiconductor growth including a material such as a sapphire, SiC, $MgAl_2O_4$, MgO, $LiAlO_2$, $LiGaO_2$, or GaN. In this case, the sapphire may be a crystal having Hexa-Rhombo R3c symmetry, may have a lattice constant of 13.001 Å in a c-axis orientation, and a lattice constant of 4.758 Å in an a-axis orientation and have a C-plane (0001), an A-plane (11-20), an R-plane (1-102), and the like. In this case, the C-plane (0001) of this sapphire substrate may allow a thin nitride film to be grown thereupon relatively easily, and may be stable even at high temperatures, and thus the C-plane is predominantly utilized as a substrate for nitride growth.

The light transmitting substrate 111 may have surfaces opposing each other, and at least one of the opposing surfaces may have an unevenness structure formed thereon. The unevenness structure may be provided by etching a portion of the light transmitting substrate 111, and may also be provided by forming a heterogeneous substance layer different from the light transmitting substrate 111.

The light emitting structure 112 may include a first conductive semiconductor layer 112A, an active layer 112B, and a second conductive semiconductor layer 112C sequentially disposed on a surface of the light transmitting substrate 111. The first and second conductive semiconductor layers 112A and 112C may be n- and p-type semiconductor layers, respectively, and may include a nitride semiconductor. However, the first and second conductive semiconductor layers 112A and 112C are not limited thereto. In some example embodiments, it may be understood that the first and second conductive semiconductor layers 112A and 112C refer to n- and p-type nitride semiconductor layers, respectively. The first and second conductive semiconductor layers 112A and 112C may have a composition of $Al_xIn_yGa_{1-x-y}N$ (0≤x≤1, 0≤y<1, and 0≤x+y<1) which corresponds to a material such as GaN, AlGaN, or InGaN.

The active layer 112B may emit visible light having a wavelength from about 350 nm to about 680 nm, and may include an undoped nitride semiconductor layer having a single quantum well (SQW) structure or a multiple quantum well (MQW) structure. The active layer 112B may be formed of, for example, an MQW structure in which quantum barrier layers and quantum well layers having respective compositions of $Al_xIn_yGa_{1-x-y}N$ (0≤x<1, 0≤y<1, and 0≤x+y<1) are alternately stacked to have a predetermined band gap. Such a quantum well may allow electrons and holes to be recombined with each other to emit light. For example, an InGaN/GaN structure may be used as the MQW structure. The first and second conductive semiconductor layers 112A and 112C and the active layer 112B may be formed using a crystal growth process such as metal organic chemical vapor deposition (MOCVD), molecular beam epitaxy (MBE), or hydride phase vapor epitaxy (HVPE).

The first electrode 113 and the second electrode 114 may be provided to contact the first conductive semiconductor layer 112A and the second conductive semiconductor layer 112C, respectively.

The first and second electrodes 113 and 114 may include a monolayer or a multilayer structure formed of the first and second conductive semiconductor layers 112A and 112C and a conductive material having ohmic characteristics. The first and second electrodes 113 and 114 may be formed by depositing, for example, at least one of materials such as gold (Au), silver (Ag), copper (Cu), zinc (Zn), aluminum (Al), indium (In), titanium (Ti), silicon (Si), germanium (Ge), tin (Sn), magnesium (Mg), tantalum (Ta), chromium (Cr), tungsten (W), ruthenium (Ru), rhodium (Rh), iridium (Ir), nickel (Ni), palladium (Pd), platinum (Pt), and a transparent conductive oxide (TCO) using sputtering or the like. The first and second electrodes 113 and 114 may be disposed in an identical direction on the first surface B provided on an opposite side of the light transmitting substrate 111, based on the light emitting structure 112. The LED chip 110 may be disposed on a surface in a flip-chip form. In this case, light emitted from the active layer 112B may be externally emitted via the light transmitting substrate 111.

The first surface B of the LED chip 110 may include a first region R1 and a second region R2 surrounding the first region R1. The first region R1 may have the first electrode 113 and the second electrode 114 disposed thereon. The second region R2 may be disposed adjacently to an edge of the first surface B of the LED chip 110.

A dam structure 140 may include a first dam structure 141 disposed adjacently to the second region R2 of the LED chip 110, and a second dam structure 142 disposed on a third region R3 between the first and second electrodes 113 and 114. The first dam structure 141 may be provided on each side of the LED chip 110, as shown in FIG. 3. The first and second dam structures 141 and 142 may extend to be integrated with each other, but may also be separated from each other. The dam structure 140 may be formed to have a greater height than that of a coated lateral wavelength conversion layer in a subsequent process of manufacturing a semiconductor light emitting device package, thereby preventing the lateral wavelength conversion layer from permeating an upper surface of an LED chip in a process of coating the lateral wavelength conversion layer. The dam structure 140 may include a mixture of materials having high reflectivity, such as $SiO_2$, SiN, $SiO_xN_y$, $TiO_2$, $Si_3N_4$, $Al_2O_3$, TiN, AlN, $ZrO_2$, TiAlN, and TiSiN, and may reflect light emitted from the active layer 112B.

Referring to FIG. 2, the semiconductor light emitting device package 100 may include the lateral wavelength conversion layer 120 disposed on the side surfaces of the LED chip 110, and the upper wavelength conversion layer 130 covering the upper surface of the LED chip 110.

The lateral wavelength conversion layer 120 may be disposed to cover the side surfaces of the LED chip 110. The lateral wavelength conversion layer 120 may be disposed to surround all of the side surfaces of the LED chip 110 to allow light emitted from the side surfaces of the LED chip 110 to be wavelength converted. Hence, the semiconductor light emitting device package 100 may provide a wider orientation angle of light as compared to a related art semiconductor light emitting device package, in which a reflective layer is formed on side surfaces of an LED chip and a wavelength conversion layer is disposed only on an upper surface of the LED chip. For example, the semiconductor light emitting device package 100 according to an example embodiment may provide light having an orientation angle greater than or equal to about 140°. The lateral wavelength conversion layer 120 may be disposed on the side surfaces of the LED chip 110, and emission of light not passing through the lateral wavelength conversion layer 120 may thus be fundamentally prevented. Hence, a color of angle (COA) of emitted light may be increased.

The lateral wavelength conversion layer 120 may be disposed on the side surfaces of the LED chip 110 to have a substantially uniform thickness. Here, the substantially uniform thickness may mean that a change in the thickness of the lateral wavelength conversion layer 120 is within an acceptable error range in a process of manufacturing the semiconductor light emitting device package 100 even in a case in which the lateral wavelength conversion layer 120 does not have a constant thickness along the side surfaces of the LED chip 110.

When the lateral wavelength conversion layer 120 may be disposed to surround all of the side surfaces of the LED chip 110, the lateral wavelength conversion layer 120 surrounding the respective side surfaces of the LED chip 110 may have the substantially uniform thickness. The lateral wavelength conversion layer 120 is not limited thereto, and in some example embodiments only portions of the lateral wavelength conversion layer 120 disposed on opposing side surfaces of the LED chip 110 may have a substantially uniform thickness.

An upper surface 123 of the lateral wavelength conversion layer 120 may be disposed to contact an edge of the upper wavelength conversion layer 130. In this case, side surfaces 122 of the lateral wavelength conversion layer 120 and side surfaces 131 of the upper wavelength conversion layer 130 may be disposed to form co-planar surfaces, respectively. A lower surface 121 of the lateral wavelength conversion layer 120 may also have a curved surface having a meniscus shape.

The lateral wavelength conversion layer 120 may include a mixture of a light transmitting material and a wavelength conversion material. In some example embodiments, such a light transmitting material may include a thermosetting resin. For example, the lateral wavelength conversion layer 120 may be a composite material in which a polymer binder including a thermosetting resin, a hardener, a curing catalyst, and the like is semi-cured (B-stage). Such a thermosetting resin may remain semi-cured when heated at a temperature lower than a threshold temperature to undergo a phase change to a level at which the thermosetting resin is malleable, but may be cured when heated at a temperature greater than a temperature. Hence, the wavelength conversion material may be coated on the side surfaces of the LED chip 110 while being semi-cured to be dispersed, and may then be cured through a heating process, thus covering the side surfaces of the LED chip 110.

A resin used in the lateral wavelength conversion layer 120 may be an epoxy resin or a silicone resin that may satisfy properties such as high levels of adhesion, high light transmittance, high heat resistance, a high refractive index, and good moisture resistance. In order to secure a high level of adhesion, an additive contributing to an improvement in adhesion, for example, a silane-based material, may be employed.

The wavelength conversion material may be a phosphor or a quantum dot. The phosphor may be a garnet-based phosphor, such as YAG, TAG, or LuAG, a silicate-based phosphor, a nitride-based phosphor, a sulfide-based phosphor, or an oxide-based phosphor, and may be configured as a single type of phosphor or multiple kinds of phosphors mixed at a predetermined ratio.

The lateral wavelength conversion layer 120 may have a structure in which a single layer is stacked, or may be formed as a multilayer structure. When the lateral wavelength conversion layer 120 is formed as a multilayer structure, each of the multiple layers may contain different types of light transmitting materials and wavelength conversion materials. In this case, the light transmitting materials forming the respective layers may have different characteristics, respectively.

For example, a light transmitting material forming a lower layer may have a characteristic in which a strength of the light transmitting material is greater than that of a light transmitting material forming an upper layer, and the lateral wavelength conversion layer 120 may thus maintain a stable shape. A light transmitting material forming a layer that contacts the upper wavelength conversion layer 130 may also have a characteristic in which the light transmitting material has higher adhesion than that of the light transmitting material forming the lower layer to thus be easily bonded to the upper wavelength conversion layer 130. One of the plurality of layers may include a transparent layer not containing a wavelength conversion material.

As illustrated in FIG. 2, the upper wavelength conversion layer 130 may be disposed to cover the entire second surface C of the LED chip 110. The upper wavelength conversion layer 130 may be formed by dispersing the wavelength conversion material in a material similar to the light transmitting material used in the lateral wavelength conversion layer 120 described above. The light transmitting material may contain the thermosetting resin described above. Hence, the light transmitting material may remain semi-cured when heated at a temperature less than a predetermined threshold temperature to undergo a phase change to a level at which the thermosetting resin is malleable, but may be cured when heated at a temperature greater than or equal to a predetermined temperature. The upper wavelength conversion layer 130 may be provided in the form of a sheet being semi-cured and having adhesiveness. The LED chip 110 may be attached to the upper wavelength conversion layer 130, and then may be cured through a heating process so that the upper wavelength conversion layer 130 may firmly adhere to an upper surface of the LED chip 110.

The wavelength conversion material may be the phosphor or the quantum dot described above. The wavelength conversion material contained in the upper wavelength conversion layer 130 may be the same as that included in the lateral wavelength conversion layer 120. The wavelength conversion material contained in the upper wavelength conversion layer 130 is not limited thereto, and may be a heterogeneous phosphor or quantum dot.

The upper wavelength conversion layer 130 may cover the entire second surface C of the LED chip 110, and may have a width W2 which covers the upper surface 123 of the lateral wavelength conversion layer 120.

A thickness W2 of the upper wavelength conversion layer 130 may be from about 15% to about 30% of a thickness W1 of the lateral wavelength conversion layer 120. When the upper wavelength conversion layer 130 and the lateral wavelength conversion layer 120 having such a thickness ratio are disposed, color variation of light emitted by the semiconductor light emitting device package 100 may be maintained to be less than or equal to $\Delta U'V'$ 0.01.

Figure 4:
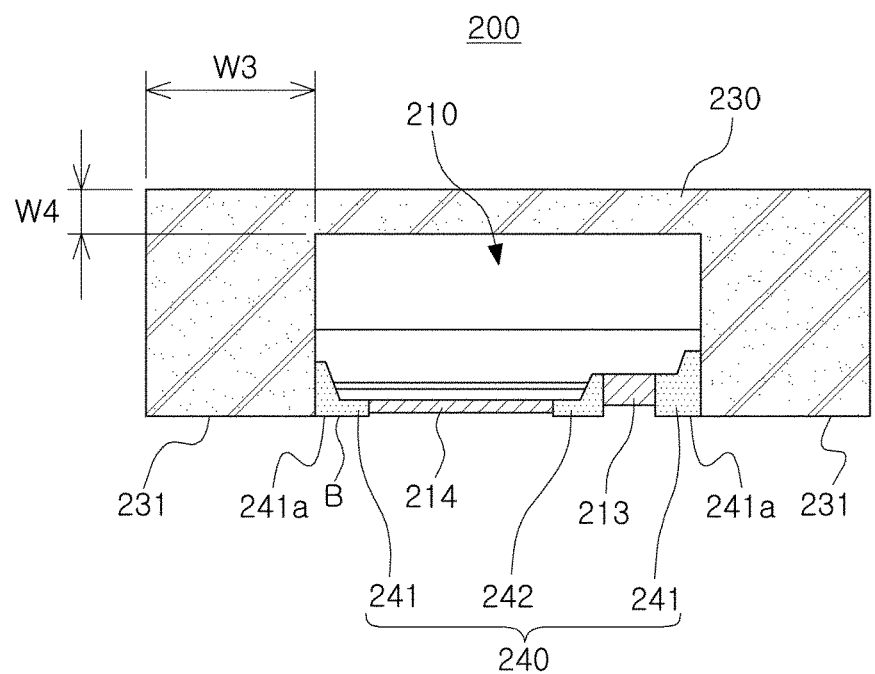
FIG. 4 is a schematic cross-sectional view of a semiconductor light emitting device package according to an example embodiment.

FIG. 4 is a schematic cross-sectional view of a semiconductor light emitting device package 200 according to an example embodiment. In the example embodiment, an LED chip 210 having a structure identical to that of the LED chip 110 described above may be used, and a detailed description of the LED chip 210 will be omitted.

The semiconductor light emitting device package 200 according to an example embodiment may include the LED chip 210 including a first electrode 213 and a second electrode 214, a wavelength conversion layer 230 covering side surfaces and an upper surface of the LED chip 210.

The wavelength conversion layer 230 of the example embodiment may differ from the lateral wavelength conversion layer 120 and the upper wavelength conversion layer 130 described above in that the wavelength conversion layer 230 may be formed as a single body. The wavelength conversion layer 230 may also differ in that a lower surface 231 of the wavelength conversion layer 230 and a lower surface 241a of a first dam structure 241 form a co-planar surface.

In the example embodiment, the side surfaces and the upper surface of the LED chip 210 may be covered with a single wavelength conversion layer 230, and the semiconductor light emitting device package 200 may thus be manufactured more easily than in the example embodiment described above with respect to FIGS. 1-3.

A thickness W4 of the wavelength conversion layer 230 may be from about 15% to about 30% of a thickness W3 thereof. When the wavelength conversion layer 230 having such a thickness ratio is disposed, color variation of light emitted by the semiconductor light emitting device package 200 may be maintained to be less than or equal to $\Delta U'V'$ 0.01.

Figure 5:
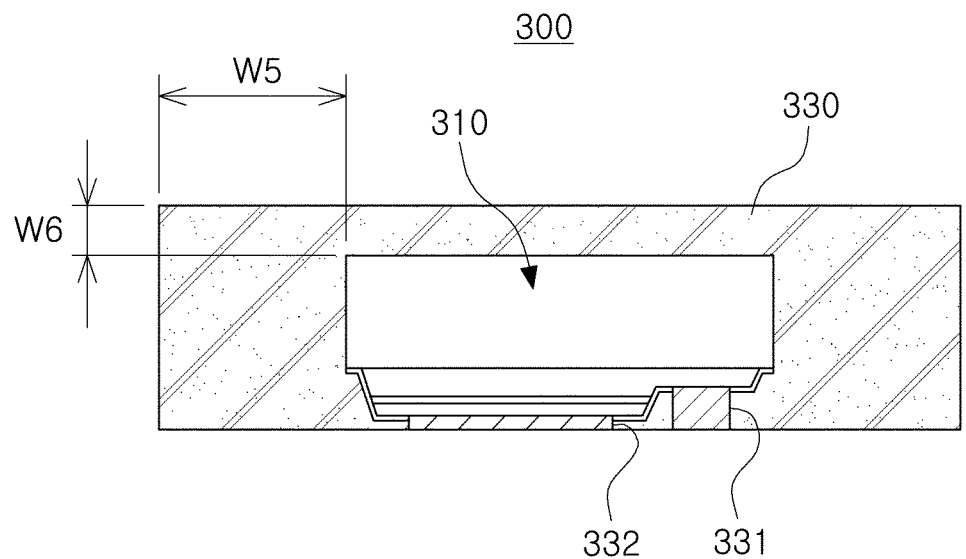
FIG. 5 is a schematic cross-sectional view of a semiconductor light emitting device package according to an example embodiment.
Figure 6:
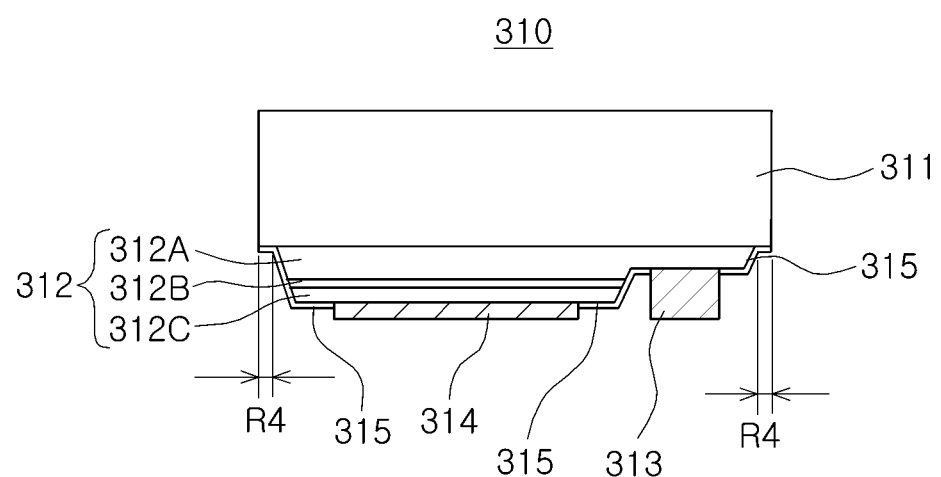
FIG. 6 is a schematic cross-sectional view of an LED chip of the semiconductor light emitting device of FIG. 5.

FIG. 5 is a schematic cross-sectional view of a semiconductor light emitting device package 300 according to an example embodiment. FIG. 6 is a schematic cross-sectional view of an LED chip of the semiconductor light emitting device package of FIG. 5. The example embodiment may differ in that an LED chip 310 having a configuration different from that of the LED chips 110 and 210 described above is adopted.

Referring to FIG. 6, the LED chip 310 of the example embodiment may differ in that a light transmitting structure 312 is completely removed from a fourth region R4 of a substrate 311, and in that a reflective layer 315 is disposed on a region including side surfaces of the light transmitting structure 312. Unlike the example embodiments described above, the LED chip 310 may also differ in that a dam structure is removed.

Turning to FIG. 5, the semiconductor light emitting device package 300 according to an example embodiment may include the LED chip 310 including a first electrode 313 and a second electrode 314, and a wavelength conversion layer 330 covering side surfaces and an upper surface of the LED chip 310, and having opening portions 331 and 332 that expose the first and second electrodes 313 and 314, respectively. The light emitting structure 312 may include a first conductive semiconductor layer 312A, an active layer 312B, and a second conductive semiconductor layer 312C.

The example embodiment may reduce a time used to manufacture a semiconductor light emitting device package by removing a dam structure, as compared to the example embodiments described above. Further, the reflective layer 315 may be disposed on the region including the side surfaces of the light transmitting structure 312 to reflect light emitted by the light transmitting structure 312 above the light transmitting structure 312. A thickness W6 of the wavelength conversion layer 330 may be from about 15% to about 30% of a thickness W5 thereof. When the wavelength conversion layer 330 having such a thickness ratio is disposed, color variation of light emitted by the semiconductor light emitting device package 300 may be maintained to be less than or equal to ΔU'V' 0.01.

Figure 7:
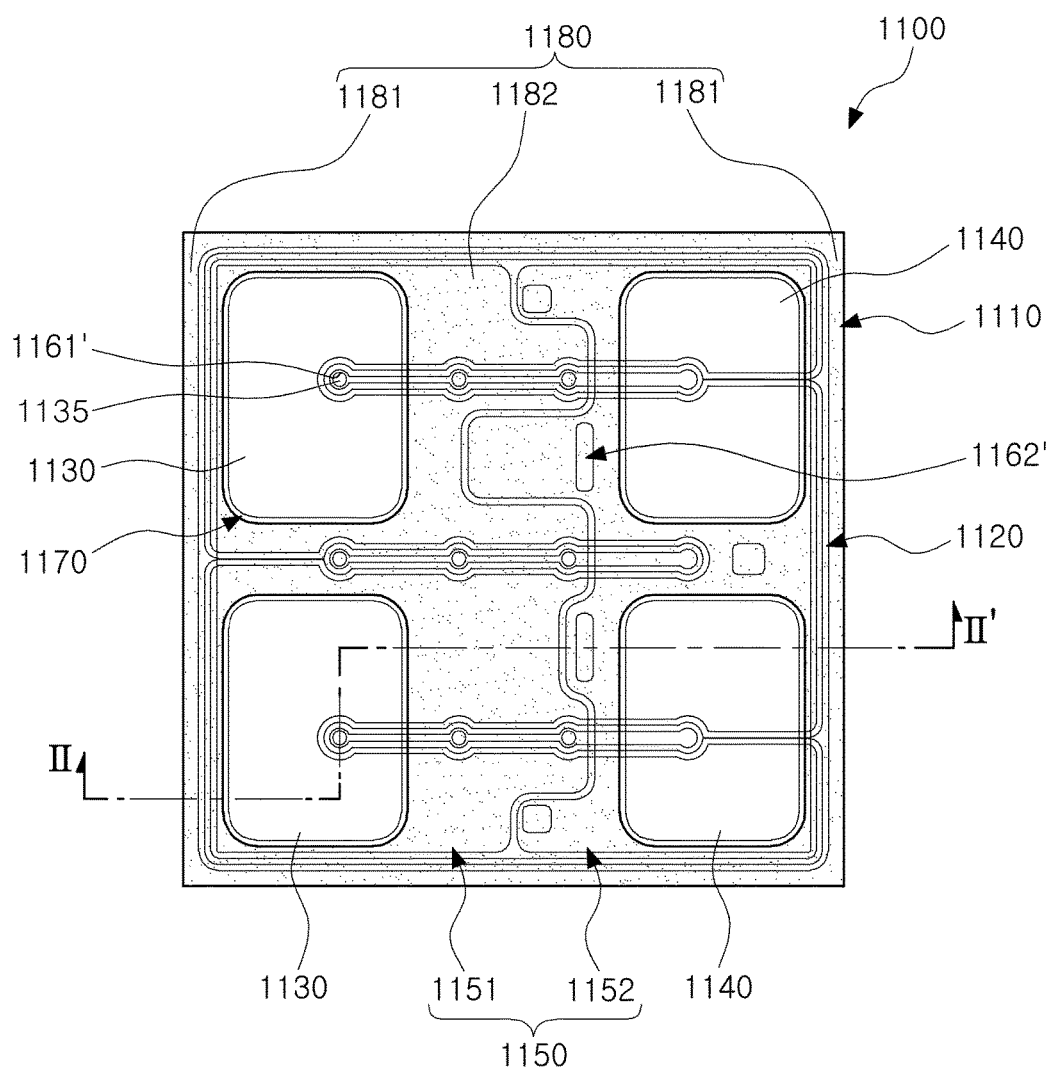
FIG. 7 is a plan view of an LED chip employed in a semiconductor light emitting device package according to an example embodiment.
Figure 8A:
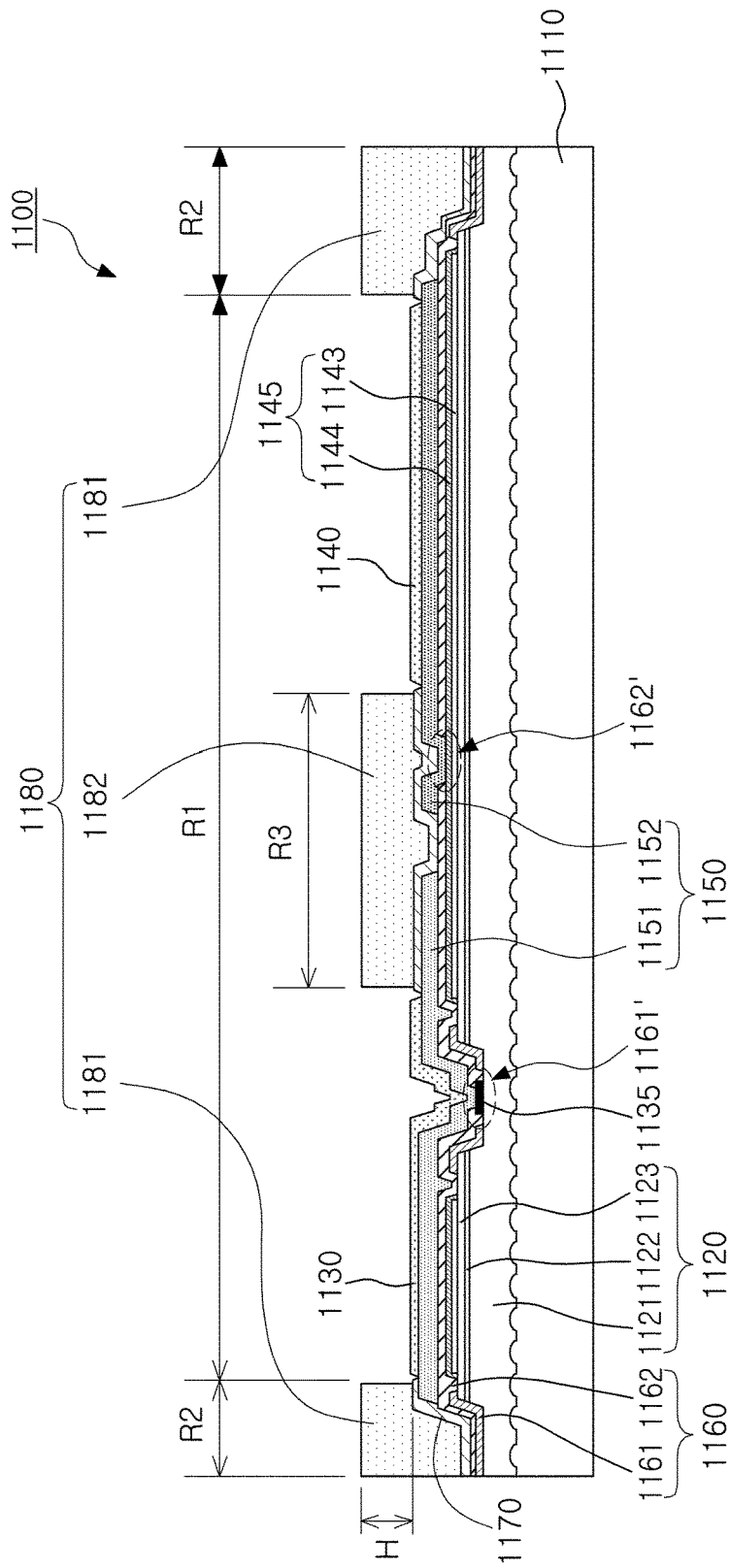
FIGS. 8A and 8B are cross-sectional views of LED chips according to an example embodiment, respectively.
Figure 8B:
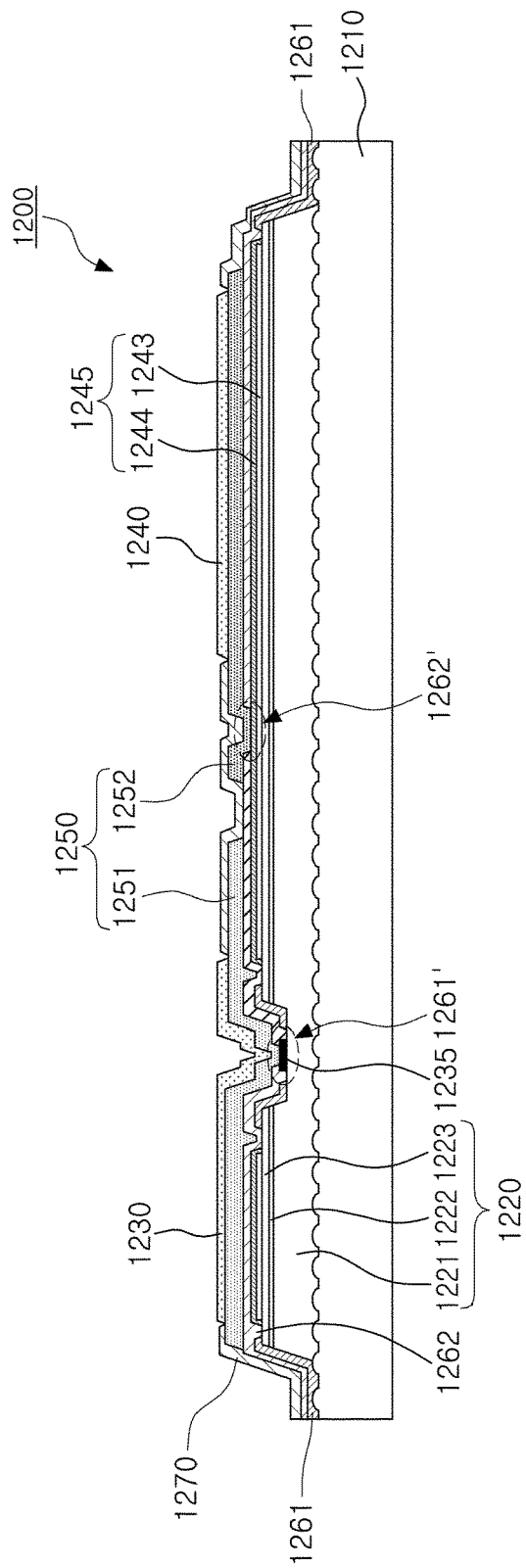

FIG. 7 is a plan view of an LED chip 1100 employed in a semiconductor light emitting device package according to an example embodiment. FIGS. 8A and 8B are cross-sectional views of LED chips according to various example embodiments, respectively.

Referring to FIGS. 7 and 8A, the LED chip 1100 according to an example embodiment may include a dam structure 1180. The dam structure 1180 may be disposed to expose a first electrode 1130 and a second electrode 1140. As illustrated in FIG. 8A, a light transmitting structure 1120 may be formed on a substrate 1110 as in the LED chip 110 illustrated in FIG. 3. The light emitting structure 1120 may include a first conductive semiconductor layer 1121, an active layer 1122, and a second conductive semiconductor layer 1123 sequentially stacked on the substrate 1110.

As described above with reference to FIG. 3, the LED chip 1100 may be disposed on a circuit board in a flip-chip form. Hence, the LED chip 1100 may include the first electrode 1130 and the second electrode 1140 as illustrated in FIGS. 7 and 8A. The first electrode 1130 and the second electrode 1140 may be formed on respective open regions from which portions of a cover layer 1170 are removed. Meanwhile, the numbers of the first electrode 1130 and the second electrode 1140 and an arrangement thereof are not limited to the drawings, and may be changed. In an example embodiment, the first electrode 1130 and the second electrode 1140 may be, for example, an under bump metallurgy (UBM) layer.

The first electrode 1130 and the second electrode 1140 may be provided on a first metal layer 1151 and a second metal layer 1152, respectively. The first metal layer 1151 may be electrically connected to a first contact electrode 1135 provided on the first conductive semiconductor layer 1121 through a first opening portion 1161', and the second metal layer 1152 may be electrically connected to a second contact electrode 1145 provided on the second conductive semiconductor layer 1123 through a second opening portion 1162' (see FIG. 8A).

Referring to FIGS. 8A and 8B, the LED chip 1100 illustrated in FIG. 7 will hereinafter be described in more detail.

FIG. 8A is a schematic cross-sectional view taken along line II-II' of the semiconductor light emitting device package 1100 of FIG. 7 as a cross-sectional view of the semiconductor light emitting device (LED chip 1100) illustrated in FIG. 7. FIG. 8B is a modification of FIG. 8A.

Referring first to FIG. 8A, the LED chip 1100 according to an example embodiment may include the substrate 1110, the light transmitting structure 1120 disposed on the substrate 1110, the first electrode 1130, the second electrode 1140 and the like. The light emitting structure 1120 may include the first conductive semiconductor layer 1121, the active layer 1122, and the second conductive semiconductor layer 1123 sequentially stacked on the substrate 1110.

The substrate 1110 may be, for example, a sapphire substrate, and may be provided as a substrate for semiconductor growth. When the substrate 1110 is the sapphire substrate, the substrate 1110 may be a crystal having Hexa-Rhombo R3c symmetry, may have a lattice constant of 13.001 Å in a c-axis orientation, and a lattice constant of 4.758 Å in an a-axis orientation, and may have a C-plane (0001), an A-plane (11-20), an R-plane (1-102), and the like. In this case, the C-plane (0001) of this sapphire substrate may allow a thin nitride film to be grown thereupon relatively easily, and may be stable even at high temperatures, and thus the C-plane may be predominantly utilized as a substrate for nitride growth. A plurality of unevenness structures may be provided on an upper surface of the substrate 1110, for example, a surface on which the light transmitting structure 1120 is formed.

A buffer layer may further be formed on the upper surface of the substrate 1110. The buffer layer may allow crystal defects of a semiconductor layer grown on the substrate 1110 to be reduced, and may include an undoped semiconductor layer formed of a nitride or the like. The buffer layer may reduce a difference between a lattice constant of the substrate 1110 including sapphire and that of the first conductive semiconductor layer 1121 stacked on the upper surface of the substrate 1110 and including a GaN layer, thereby increasing crystallinity of the GaN layer. Undoped GaN, AlN, and InGaN layers, and the like, may be applied to the buffer layer, and the buffer layer may be grown to have tens to hundreds Å of thicknesses at a low temperature of 500° C. to 600° C. Here, the term "undope" may mean that the semiconductor layer does not undergo an additional impurity doping process. For example, when a gallium nitride semiconductor including an impurity which is inherently present in the semiconductor layer and has a level of concentration is grown using metal organic chemical vapor deposition (MOCVD), Si or the like used as a dopant may be unintentionally contained in the semiconductor layer at a level of about $110^4$ to about $110^8/cm^3$. Such a buffer layer may be a necessary element in the example embodiment, and may be omitted according to some example embodiments.

As described above, the light emitting structure 1120 may include the first conductive semiconductor layer 1121, the active layer 1122, and the second conductive semiconductor layer 1123. The first conductive semiconductor layer 1121 may include a semiconductor doped with an n-type impurity, and may be an n-type nitride semiconductor layer. The second conductive semiconductor layer 1123 may include a semiconductor doped with a p-type impurity, and may be a p-type nitride semiconductor layer. According to an example embodiment, the order in which the first conductive semiconductor layer 1121 and the second conductive semiconductor layer 1123 are stacked may also be reversed. The first and second conductive semiconductor layers 1121 and 1123 may have a composition of $Al_xIn_yGa_{1-x-y}N$ ($0 \leq x \leq 1$, $0 \leq y \leq 1$, and $0 \leq x+y \leq 1$) which corresponds to a material such as GaN, AlGaN, InGaN, or AlInGaN.

The active layer 1122 may be disposed between the first and second conductive semiconductor layers 1121 and 1123 to emit light having a level of energy by a recombination of electrons and holes. The level of energy may be predetermined. The active layer 1122 may contain a material having an energy band gap less than that of the first and second conductive semiconductor layers 1121 and 1123. For example, when the first and second conductive semiconductor layers 1121 and 1123 are a GaN-based compound semiconductor, the active layer 1122 may include an InGaN-based compound semiconductor having an energy band gap less than that of GaN. The active layer 1122 may have an MQW structure in which quantum well layers and quantum barrier layers are alternately stacked on each other, for example, an InGaN/GaN structure. The active layer 1122 is not limited thereto, and may also have an SQW structure.

In a manufacturing process, the light transmitting structure 1120 may be formed on the substrate 1110, and then at least a region of the light transmitting structure 1120 may be removed, thereby forming a mesa region and an etching region.

The first contact electrode 1135 and the second contact electrode 1145 may be disposed on the first conductive semiconductor layer 1121 and the second conductive semiconductor layer 1123, respectively. The first contact electrode 1135 may be disposed on the first conductive semiconductor layer 1121 on the etching region, and the second contact electrode 1145 may be disposed on the second conductive semiconductor layer 1123 on the mesa region. The first contact electrode 1135 may have pad portions and a finger portion having narrower widths than those of the pad portions so that electrodes may be uniformly injected therein as illustrated in FIG. 7. The pad portions may be disposed to be spaced apart from each other, and the finger portion may connect the pad portions to each other.

The second contact electrode 1145 may include a reflective metal layer 1143 and a coating metal layer 1144 covering the reflective metal layer 1143. The coating metal layer 1144 may be selectively provided, and may also be removed according to an example embodiment. The second contact electrode 1145 may have a shape that covers an upper surface of the second conductive semiconductor layer 1123. For example, the second contact electrode 1145 may have a greater surface area than that of the first contact electrode 1135 considering characteristics of the second conductive semiconductor layer 1123 having a relatively great electrical resistance, and may include a plurality of layers as illustrated in FIG. 8A. The first contact electrode 1135 and the second contact electrode 1145 may be formed on regions provided by selectively removing portions of a first insulating layer 1161 formed on the light transmitting structure 1120.

A second insulating layer 1162 may be provided on the first contact electrode 1135 and the second contact electrode 1145. The second insulating layer 1162 may expose at least a portion of each of the first contact electrode 1135 and the second contact electrode 1145. As described above, at least a portion of the first and second insulating layers 1161 and 1162 collectively represented by an insulating layer 1160 may be removed, and the first opening portion 1161' and the second opening portion 1162' may thus be provided on the first contact electrode 1135 and the second contact electrode 1145, respectively. The insulating layer 1160 may contain a silicon oxide or a silicon nitride such as $SiO_2$, SiN, $SiO_xN_y$, $TiO_2$, $Si_3N_4$, $Al_2O_3$, TiN, AlN, $ZrO_2$, TiAlN, or TiSiN.

A metal layer 1150 may be provided on the insulating layer 1160. The metal layer 1150 may include the first metal layer 1151 and the second metal layer 1152. The first contact electrode 1135 may be connected to the first metal layer 1151 through the first opening portion 1161', and the second contact electrode 1145 may be connected to the second metal layer 1152 through the second opening portion 1162'. The metal layer 1150 may include, for example, a material such as Au, W, Pt, Si, Ir, Ag, Cu, Ni, Ti, or Cr, and a material including at least one of alloys thereof.

As an insulating material, the cover layer 1170 may further be provided on the metal layer 1150, and may cover side surfaces of the light transmitting structure 1120 and the metal layer 1150. Regions of the cover layer 1170 may be selectively removed, and the first electrode 1130 and the second electrode 1140 may be provided on the regions that are removed from the cover layer 1170. In other words, as illustrated in FIG. 8A, the first electrode 1130 may be disposed on the first metal layer 1151, and the second electrode 1140 may be disposed on the second metal layer 1152. Resultantly, the first electrode 1130 may be electrically connected to the first conductive semiconductor layer 1121 through the first metal layer 1151 and the first contact electrode 1135, and the second electrode 1140 may be electrically connected to the second conductive semiconductor layer 1123 through the second metal layer 1152 and the second contact electrode 1145.

As described above, the LED chip 1100 according to an example embodiment may have the dam structure 1180 provided adjacently to an edge of the LED chip 1100. The dam structure 1180 may include a first dam structure 1181 disposed adjacently to a second region R2 of the LED chip 1100, and a second dam structure 1182 disposed on a third region R3 between the first and second electrodes 1130 and 1140. The first and second dam structures 1181 and 1182 may extend to be integrated with each other, but may also be separated from each other. The dam structure 1180 may be formed by disposing a mask on the first and second electrodes 1130 and 1140 of the LED chip 1100, injecting a resin including a filler such as $TiO_2$ into the mask, and then hardening the mask. In this case, the dam structure 1180 may be formed to have a greater height than that of a coated lateral wavelength conversion layer in a subsequent process of manufacturing a semiconductor light emitting device package, thereby preventing the lateral wavelength conversion layer from permeating an upper surface of an LED chip in the process of coating the lateral wavelength conversion layer.

FIG. 8B illustrates an LED chip 1200 according to an example embodiment. The LED chip 1200 may differ from the LED chip 1100 of the example embodiment described above in that a substrate 1210 may be exposed by completely removing an edge of a light transmitting structure 1220. The LED chip 1200 may also differ in that side surfaces of the light transmitting structure 1220 may be covered with a first insulating layer 1261. The insulating layer 1261 may contain a silicon oxide or a silicon nitride such as $SiO_2$, SiN, $SiO_xN_y$, $TiO_2$, $Si_3N_4$, $Al_2O_3$, TiN, AlN, $ZrO_2$, TiAlN, or TiSiN. Hence, light emitted to the side surfaces of the light transmitting structure 1220 may be fundamentally blocked, and the emitted light may be emitted only through the substrate 1210. Resultantly, when the LED chip 1200 is applied to the semiconductor light emitting device package 300 of FIG. 5, light may be prevented from being emitted to the side surfaces of the light transmitting structure 1220 without using a dam structure.

FIGS. 9A through 9F are diagrams illustrating a method of manufacturing the LED chip 1110 of FIG. 8A.

Referring first to FIG. 9A, the light transmitting structure 1120 may be formed on the substrate 1110. The light emitting structure 1120 may include the first conductive semiconductor layer 1121, the active layer 1122, and the second conductive semiconductor layer 1123 sequentially stacked on the substrate 1110. As illustrated in FIG. 9A, the substrate 1110 may include an unevenness structure provided on a surface on which the first conductive semiconductor layer 1121 is formed, and may contain a material such as sapphire, Si, SiC, $MgAl_2O_4$, MgO, $LiAlO_2$, $LiGaO_2$, or GaN.

The light transmitting structure 1120 may be formed by sequentially growing the first conductive semiconductor layer 1121, the active layer 1122, and the second conductive semiconductor layer 1123 on the substrate 1110 using a process such as metal organic chemical vapor deposition (MOCVD), hydride vapor phase epitaxy (HVPE), or a molecular beam epitaxy (MBE). The first conductive semiconductor layer 1121 and the second conductive semiconductor layer 1123 may be an n-type semiconductor layer and a p-type semiconductor layer, respectively. Locations of the first conductive semiconductor layer 1121 and the second conductive semiconductor layer 1123 may be changed with each other in the light transmitting structure 1120, and the second conductive semiconductor layer 1123 may be formed first on the substrate 1110.

Referring to FIG. 9B, a portion of the light transmitting structure 1120 may be etched to expose at least a portion of the first conductive semiconductor layer 1121. The first insulating layer 1161 may be formed on a region on which the portion of the first conductive semiconductor layer 1121 is exposed. A portion of the first insulating layer 1161 may be removed, and portions of the first conductive semiconductor layer 1121 and the second conductive semiconductor layer 1123 may thus be exposed.

Referring next to FIG. 9C, the first contact electrode 1135 may be formed in the first opening portion 1161', and the second contact electrode 1145 may be formed. The second contact electrode 1145 may include the reflective metal layer 1143 and the coating metal layer 1144. The first contact electrode 1135 may have the plurality of pad portions and the finger portions extending from the plurality of pad portions as illustrated in FIG. 7.

Referring to FIG. 9D, the second insulating layer 1162 may have a structure in which the light transmitting structure 1120 is entirely covered by the second insulating layer 1162. Portions of the second insulating layer 1162 may be selectively removed on the first contact electrode 1135 and the second contact electrode 1145, and the first metal layer 1151 and the second metal layer 1152 may be formed on the second insulating layer 1162. The first metal layer 1151 may be electrically connected to the first contact electrode 1135 through the first opening portion 1161' in the first insulating layer 1161, and the second metal layer 1152 may be electrically connected to the second contact electrode 1145 through the second opening portion 1162' in the second insulating layer 1162.

Figure 9E:
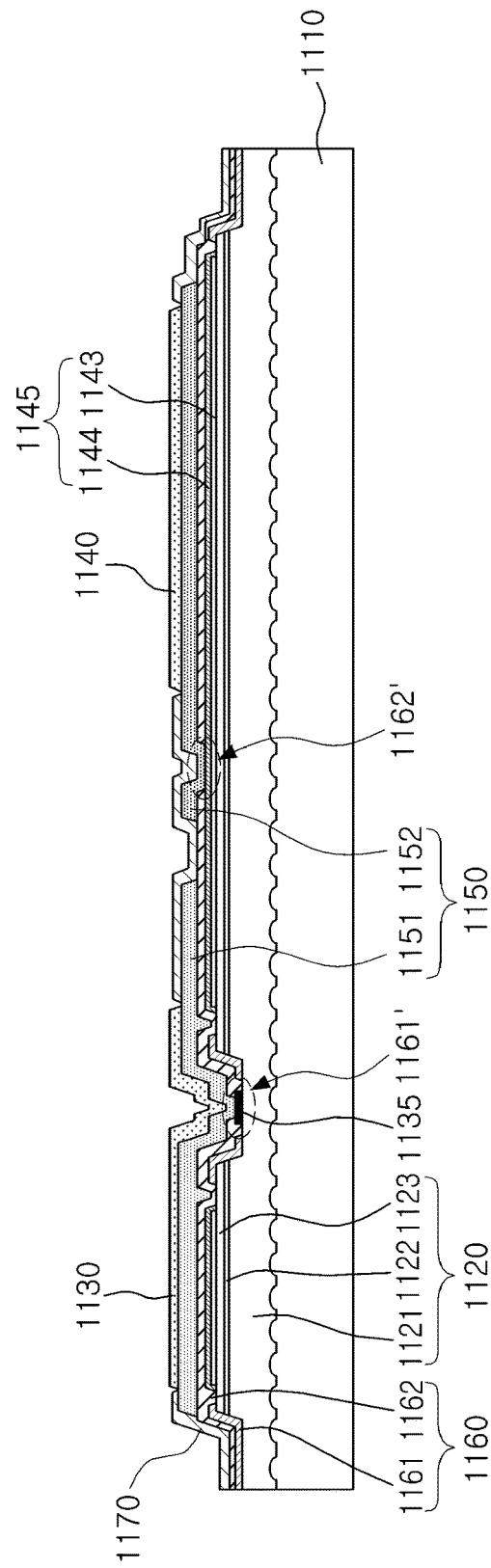

Referring to FIG. 9E, the cover layer 1170 may be formed on the first and second metal layers 1151 and 1152, and the first and second electrodes 1130 and 1140 may be provided on removed regions of the cover layer 1170. The first and second electrodes 1130 and 1140 may be electrically connected to the first and second metal layers 1151 and 1152, respectively. The cover layer 1170 may contain a material having electrically insulating characteristics such as $SiO_2$, SiN, $SiO_xN_y$, $TiO_2$, $Si_3N_4$, $Al_2O_3$, TiN, AlN, $ZrO_2$, TiAlN, or TiSiN.

Figure 9F:
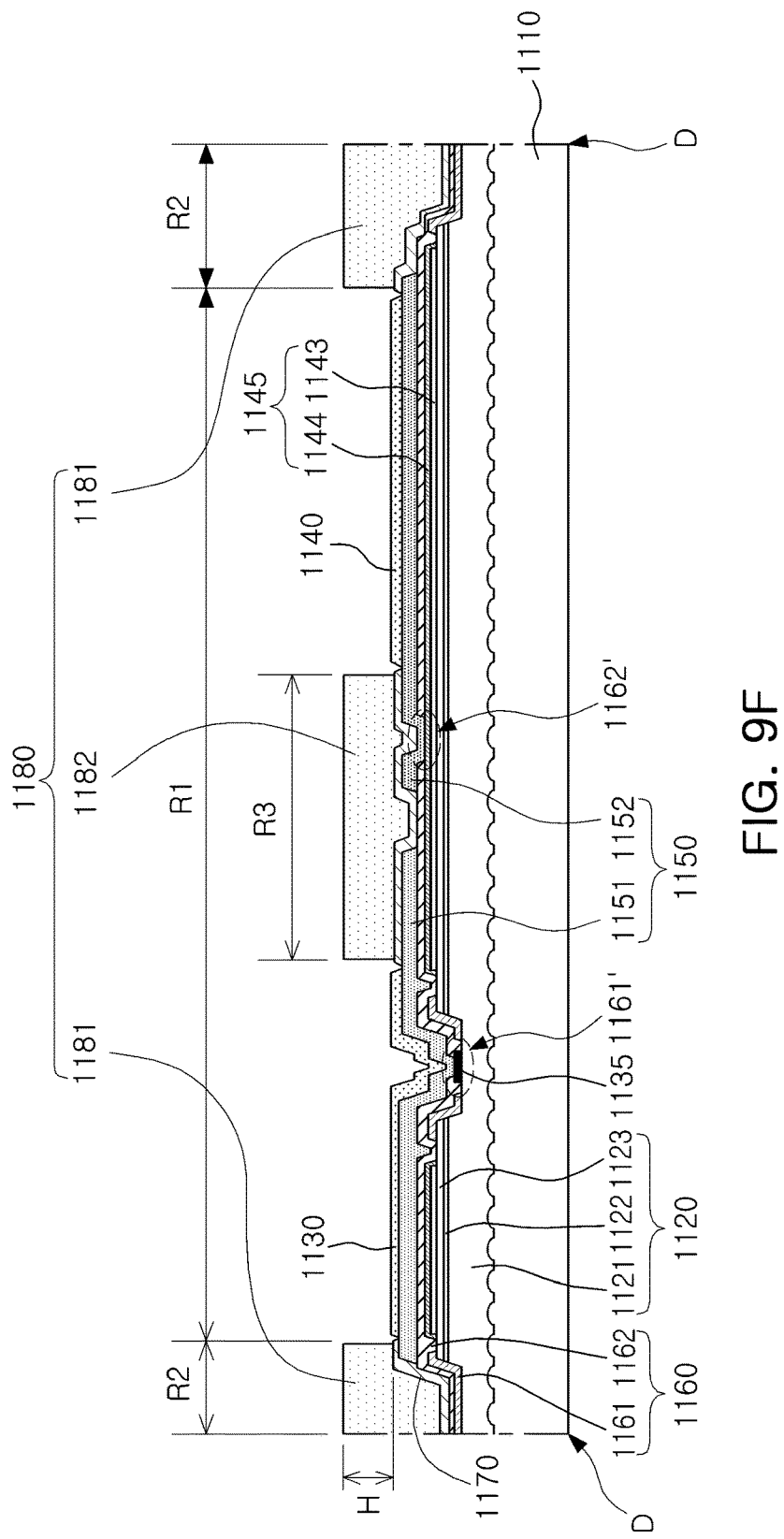

Referring to FIG. 9F, the dam structure 1180 may be formed to be provided adjacently to the edge of the LED chip 1100. The dam structure 1180 may be formed by disposing the mask on the first and second electrodes 1130 and 1140 of the LED chip 1100, injecting the resin including the filler such as $TiO_2$ into the mask, and then hardening the mask. When the LED chip is cut into individual LED chip units D, the LED chip 1100 of FIG. 8A may be manufactured.

A process of manufacturing the semiconductor light emitting device package 200 will next be described. FIGS. 10A through 10D are views illustrating the process of manufacturing the semiconductor light emitting device package 100 of FIG. 1.

Figure 10A:
FIGS. 10A through 10D are views illustrating a process of manufacturing the semiconductor light emitting device package of FIG. 2, according to an example embodiment.

As first illustrated in FIG. 10A, a wavelength conversion layer sheet 130a may be prepared. The wavelength conversion layer sheet 130a may be provided in a flexible semi-cured state by mixing a light transmitting material with a wavelength conversion material such as a phosphor or a quantum dot. Such a light transmitting material may be formed using an epoxy resin or a silicone resin.

The wavelength conversion layer sheet 130a may be provided in a semi-cured state while having adhesiveness by being heated at a temperature lower than a curing temperature after mixing the light transmitting material with light reflecting particles, and may be used to attach and align the LED chip 110 in a subsequent process.

Figure 10B:
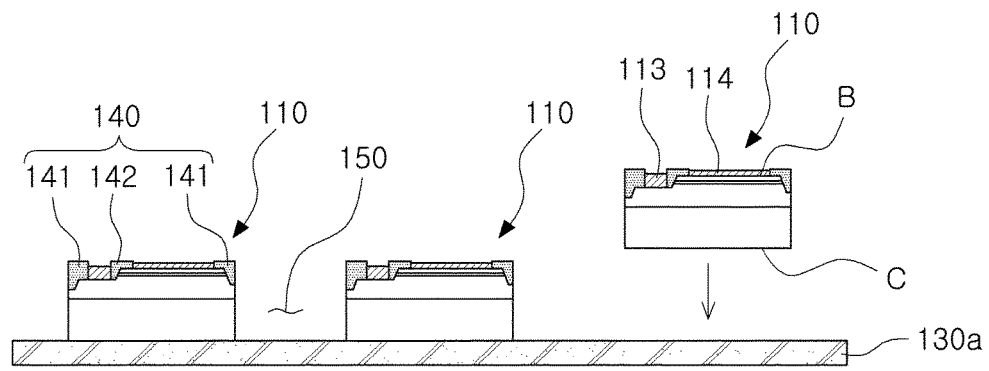

As next illustrated in FIG. 10B, a plurality of prepared LED chips 110 may be arranged on a surface of the wavelength conversion layer sheet 130a. Each of the LED chips 110 may be disposed to allow the first surface B on which the first and second electrodes 113 and 114 are disposed to be exposed, and each of the LED chips 110 may be disposed such that the second surface C thereof is attached to the wavelength conversion layer sheet 130a. The chip separation regions 150 between the plurality of LED chips 110 may be determined considering spaces on which the lateral wavelength conversion layers 120 will be formed in a subsequent process and regions which will disappear in the process of cutting into the individual semiconductor light emitting device packages 100.

After the LED chips 110 are attached to the wavelength conversion layer sheet 130a, the wavelength conversion layer sheet 130a may be heated at a temperature greater than or equal to a curing temperature, becoming hardened. In an example embodiment, the wavelength conversion layer sheet 130a may remain heated for about 30 minutes at a temperature of about 150° C., becoming hardened.

Figure 10C:
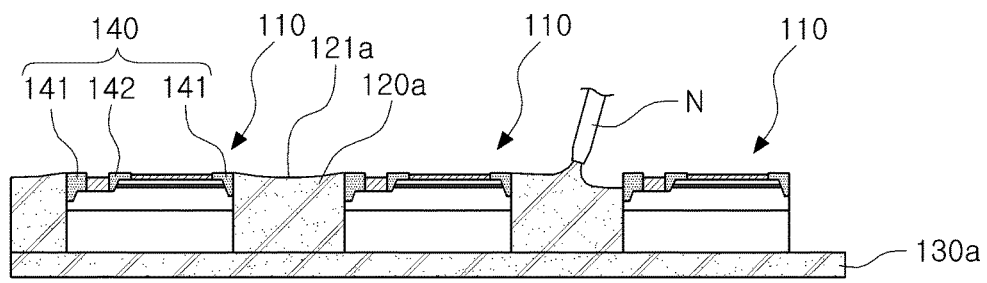

As next illustrated in FIG. 10C, wavelength conversion layers 120a may be formed by coating spaces between the plurality of LED chips 110 with a wavelength conversion material. As described above, the wavelength conversion material may be coated in the spaces while being dispersed in a liquid light transmitting material. In more detail, the wavelength conversion material may be dispensed using a nozzle N. When the wavelength conversion layers 120a are formed by dispersing the wavelength conversion material in the liquid light transmitting material and then dispensing the wavelength conversion material, meniscuses 121a may be formed on surfaces of the wavelength conversion layers 120a by surface tension.

After the wavelength conversion material is coated, the wavelength conversion material may be heated at a temperature greater than or equal to a curing temperature of the light transmitting material to be cured, and thus the wavelength conversion layers 120a may be formed. In an example embodiment, the wavelength conversion material may remain heated for about 30 minutes at a temperature of about 150° C., forming the wavelength conversion layers 120a.

Figure 10D:
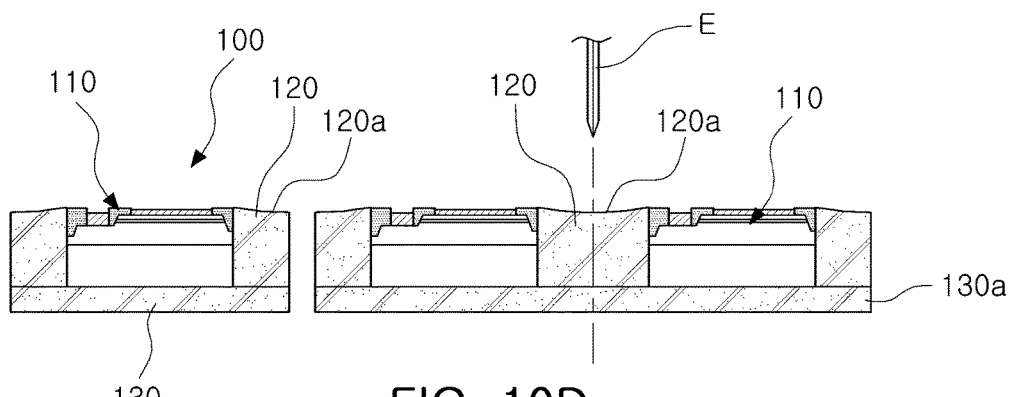

As next illustrated in FIG. 10D, use of a blade E may allow the wavelength conversion layer sheet 130a and the wavelength conversion layers 120a to be cut into the individual semiconductor light emitting device packages 100. In this case, the wavelength conversion layers 120a may be cut in half so that the lateral wavelength conversion layers 120 having identical thicknesses may be disposed on the side surfaces, respectively, of each of the semiconductor light emitting device packages 100. A method of separating the individual semiconductor light emitting device packages 100 is not limited thereto, and a method of separating the individual semiconductor light emitting device packages 100 using a laser beam, water jet, or the like may also be applied.

A process of manufacturing the semiconductor light emitting device package 200 will next be described. FIGS. 11A through 11E are views illustrating the process of manufacturing the semiconductor light emitting device package 200 of FIG. 4.

Figure 11A:
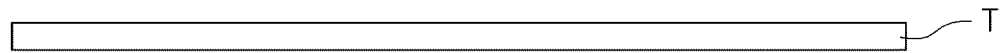
FIGS. 11A through 11E are views illustrating a process of manufacturing the semiconductor light emitting device package of FIG. 4, according to an example embodiment.

As first illustrated in FIG. 11A, an adhesive sheet T may be prepared. The adhesive sheet T may have a base film with a surface on which an adhesive layer is formed, and may be used to bond an LED chip in a subsequent process.

Figure 11B:
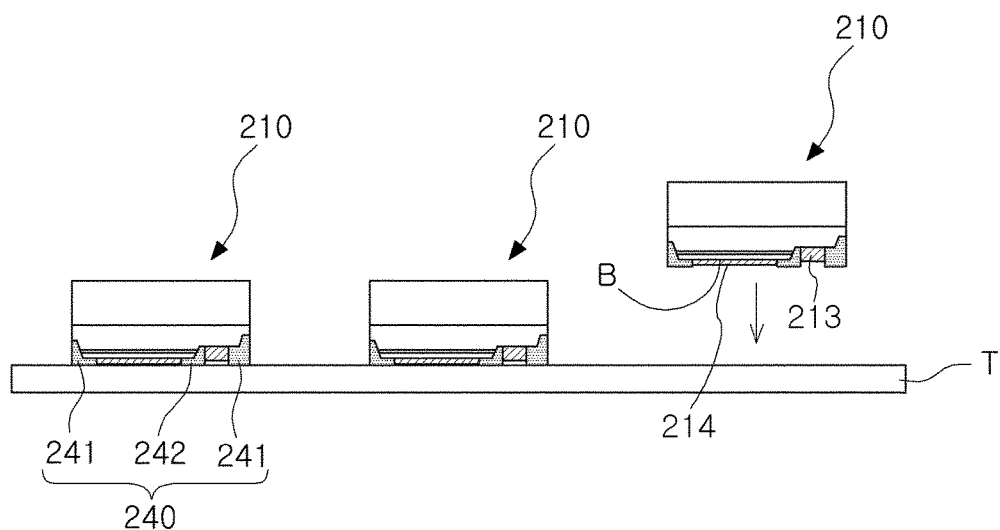

As next illustrated in FIG. 11B, a plurality of prepared LED chips 210 may be arranged on the adhesive layer of the adhesive sheet T. The LED chips 210 may be disposed to allow the first surface B on which the first and second electrodes 213 and 214 are disposed to be bonded to the adhesive sheet T.

Figure 11C:
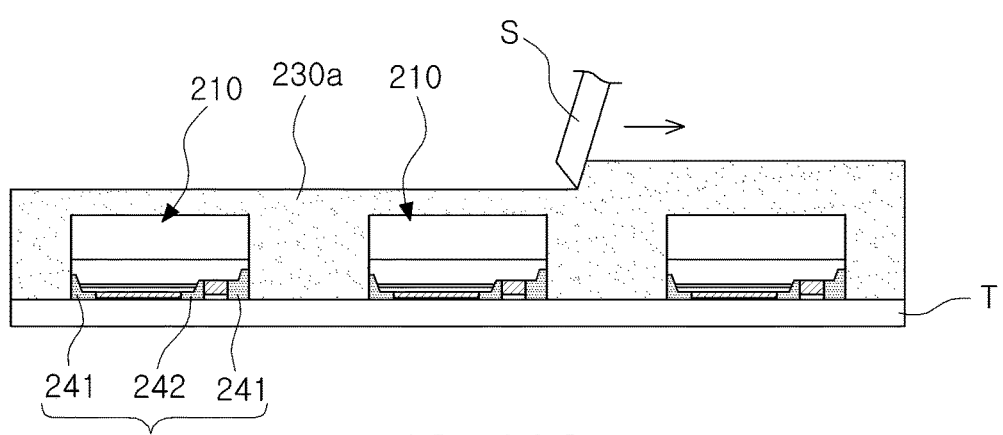

As next illustrated in FIG. 11C, a wavelength conversion layer 230a may be formed by coating a wavelength conversion material onto the plurality of LED chips 210. The wavelength conversion material may be coated onto a light transmitting material being in a paste state while being dispersed therein. In particular, the wavelength conversion material may be coated using a method of screen printing a paste using a squeezer S.

Figure 11D:
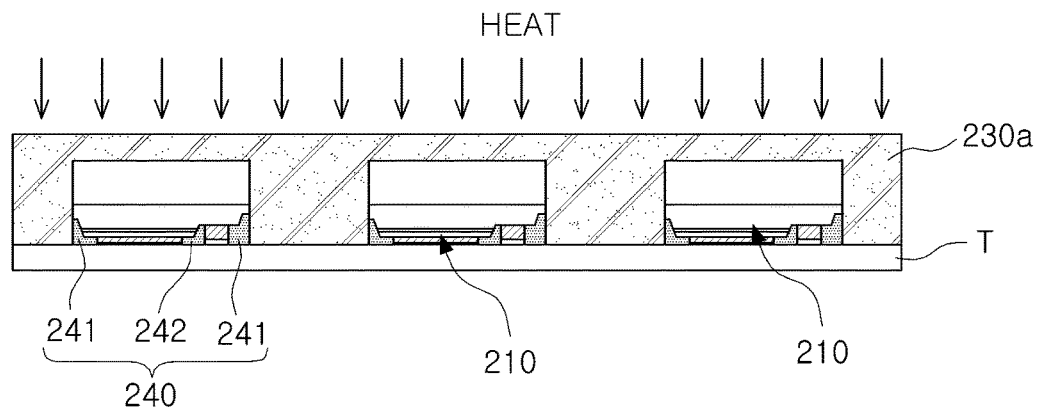

As next illustrated in FIG. 11D, the wavelength conversion layer 230a may be heated at a curing temperature or higher to be cured.

Figure 11E:
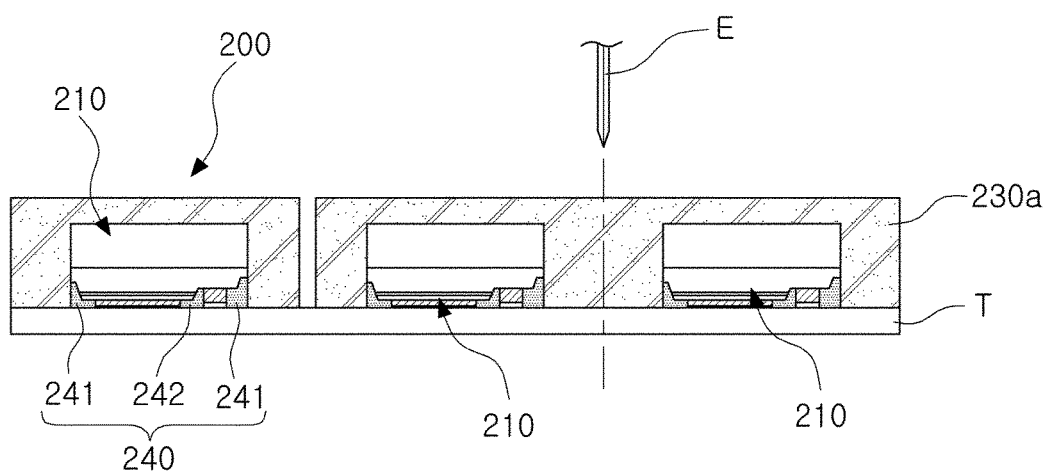

As next illustrated in FIG. 11E, the wavelength conversion layer 230a may be cut into individual semiconductor light emitting device packages 200 by using a blade E, and then the adhesive sheet T may be removed.

As set forth above, according to example embodiments, disposal of a wavelength conversion layer on side surfaces and an upper surface of an LED chip may allow a semiconductor light emitting device package having improved color quality and an increased orientation angle of light to be provided.

While example embodiments have been shown and described above, it will be apparent to those skilled in the art that modifications and variations may be made without departing from the scope of the present inventive concept as defined by the appended claims.

What is claimed is:

1. A semiconductor light emitting device package comprising:
   a light emitting diode (LED) chip comprising a substrate with a plurality of unevenness structures, a buffer layer formed on the substrate, a light emitting structure disposed on the buffer layer, and a first contact electrode and a second contact electrode disposed on a first surface of the light emitting structure opposite to the substrate, the first contact electrode and the second contact electrode being electrically connected to the light emitting structure;
   a dam structure disposed on a second surface of the LED chip opposite to the substrate; and
   a wavelength conversion layer disposed to cover the substrate,
   wherein the first contact electrode has pad portions and a finger portion having narrower widths than those of the pad portions, and the finger portion connect the pad portions to each other,
   wherein the second contact electrode includes a reflective metal layer and a coating metal layer covering the reflective metal layer.

2. The semiconductor light emitting device package of claim 1, wherein the wavelength conversion layer is disposed to cover side surfaces of the LED chip except the first surface on which the first contact electrode and the second contact electrode are disposed.

3. The semiconductor light emitting device package of claim 2, wherein the wavelength conversion layer covering the substrate has a first uniform thickness, and the wavelength conversion layer covering the side surfaces of the LED chip has a second uniform thickness.

4. The semiconductor light emitting device package of claim 1, wherein a reflective layer is disposed on a side surface of the light emitting structure.

5. The semiconductor light emitting device package of claim 1, wherein the dam structure includes a first dam structure disposed adjacently to an edge of the LED chip, and a second dam structure disposed between the first electrode and the second electrode.

6. The semiconductor light emitting device package of claim 5, wherein the first dam structure forms a co-planar surface with a side surface of the LED chip.

7. The semiconductor light emitting device package of claim 1, wherein a first lower surface of the dam structure forms a co-planar surface with a second lower surface of the wavelength conversion layer covering side surfaces of the LED chip.

8. The semiconductor light emitting device package of claim 1, wherein a first height of the dam structure is greater than a second height of the first electrode, and is greater than a third height of the second electrode.

9. A semiconductor light emitting device package comprising:
   a light emitting diode (LED) chip comprising a substrate with a plurality of unevenness structures, a buffer layer formed on the substrate, a light emitting structure disposed on the buffer layer, and a first contact electrode and a second contact electrode disposed on a first surface of the light emitting structure opposite to the substrate, the first contact electrode and the second contact electrode being electrically connected to the light emitting structure;
   a dam structure disposed on a second surface of the LED chip opposite to the substrate; and
   a wavelength conversion layer disposed to cover the substrate,
   wherein the first contact electrode has pad portions and a finger portion having narrower widths than those of the pad portions, and the finger portion connects the pad portions to each other,
   wherein the second contact electrode has a greater surface area than that of the first contact electrode.

10. The semiconductor light emitting device package of claim 9, wherein the wavelength conversion layer is disposed to cover side surfaces of the LED chip except the first surface on which the first contact electrode and the second contact electrodes are disposed.

11. The semiconductor light emitting device package of claim 9, wherein a reflective layer is disposed on a side surface of the light emitting structure.

12. The semiconductor light emitting device package of claim 9, wherein the wavelength conversion layer covering the substrate has a first uniform thickness, and the wavelength conversion layer covering side surfaces of the LED chip has a second uniform thickness.

13. The semiconductor light emitting device package of claim 9, wherein the dam structure includes a first dam structure disposed adjacently to an edge of the LED chip, and a second dam structure disposed between the first electrode and the second electrode.

14. The semiconductor light emitting device package of claim 13, wherein the first dam structure forms a co-planar surface with a side surface of the LED chip.

15. The semiconductor light emitting device package of claim 9, wherein a first height of the dam structure is greater than a second height of the first electrode, and is greater than a third height of the second electrode.

16. A semiconductor light emitting device package comprising:
- a light emitting diode (LED) chip comprising a first electrode and a second electrode, the LED chip having a first surface on which the first electrode and the second electrode are disposed, and a second surface opposing the first surface;
- a dam structure disposed on the first surface of the LED chip; and
- a wavelength conversion layer disposed on first side surfaces of the LED chip, the second surface of the LED chip, and at least one surface of the dam structure, the wavelength conversion layer containing a wavelength conversion material.

17. The semiconductor light emitting device package of claim 16, wherein a reflective layer is disposed on a side surface of the LED chip.

18. The semiconductor light emitting device package of claim 16, wherein the wavelength conversion layer covering the second surface of the LED chip has a first uniform thickness, and the wavelength conversion layer covering side surfaces of the LED chip has a second uniform thickness.

19. The semiconductor light emitting device package of claim 16, wherein the dam structure includes a first dam structure disposed adjacently to an edge of the LED chip, and a second dam structure disposed between the first electrode and the second electrode.

20. The semiconductor light emitting device package of claim 19, wherein the first dam structure forms a co-planar surface with a side surface of the LED chip.

* * * * *